United States Patent
Min et al.

(10) Patent No.: US 11,322,352 B2
(45) Date of Patent: May 3, 2022

(54) NITROGEN-DOPED CARBON HARDMASK FILMS

(71) Applicant: Applied Materials, Inc., Santa Clara, CA (US)

(72) Inventors: Xiaoquan Min, Mountain View, CA (US); Lu Xu, Santa Clara, CA (US); Prashant Kumar Kulshreshtha, San Jose, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/853,283

(22) Filed: Apr. 20, 2020

(65) Prior Publication Data

US 2021/0327713 A1    Oct. 21, 2021

(51) Int. Cl.
*H01L 21/033*    (2006.01)
*H01L 21/02*    (2006.01)

(52) U.S. Cl.
CPC .... *H01L 21/0332* (2013.01); *H01L 21/02115* (2013.01); *H01L 21/02205* (2013.01); *H01L 21/02274* (2013.01)

(58) Field of Classification Search
CPC ........... H01L 21/0332; H01L 21/02205; H01L 21/02274; H01L 21/02115
See application file for complete search history.

(56) References Cited

U.S. PATENT DOCUMENTS

| | | | |
|---|---|---|---|
| 7,407,893 | B2 | 8/2008 | Seamons et al. |
| 8,536,065 | B2 | 9/2013 | Seamons et al. |
| 8,563,414 | B1 * | 10/2013 | Fox ........................ C23C 16/26 438/590 |
| 9,337,051 | B2 | 5/2016 | Mebarki et al. |
| 9,406,509 | B2 | 8/2016 | Manna et al. |
| 9,659,771 | B2 | 5/2017 | Mebarki et al. |
| 9,711,360 | B2 | 7/2017 | Duan et al. |
| 2011/0244142 | A1 * | 10/2011 | Cheng .................... C23C 16/26 427/569 |
| 2012/0208373 | A1 | 8/2012 | Padhi et al. |
| 2016/0049305 | A1 | 2/2016 | Mebarki et al. |
| 2017/0103893 | A1 * | 4/2017 | Kulshreshtha ...... H01L 21/3065 |

OTHER PUBLICATIONS

International Search Report and Written Opinion dated Jun. 4, 2021 for Application No. PCT/US2021/017591.

* cited by examiner

*Primary Examiner* — Julia Slutsker
(74) *Attorney, Agent, or Firm* — Patterson + Sheridan, LLP

(57) ABSTRACT

Disclosed herein is a method and apparatus for forming carbon hard masks to improve deposition uniformity and etch selectivity. The carbon hard mask may be formed in a PECVD process chamber and is a nitrogen-doped carbon hardmask. The nitrogen-doped carbon hardmask is formed using a nitrogen containing gas, an argon containing gas, and a hydrocarbon gas.

21 Claims, 6 Drawing Sheets

NITROGEN-DOPED CARBON HARDMASK FILMS

BACKGROUND

Field

Embodiments of the present disclosure generally relate to the fabrication of integrated circuits and to a process for depositing materials on a substrate and to the structures formed by the materials.

Description of the Related Art

Reducing the size of integrated circuits (ICs) results in improved performance, increased capacity and/or reduced cost of production. Each size reduction requires more sophisticated techniques to form the ICs. Photolithography is commonly used to pattern ICs on a substrate. Producing patterned material on a substrate requires controlled methods for removal of exposed material. Carbon based films may be used as hard masks and etch stop layers in semiconductor processing, including in memory and logic device fabrication. As aspect ratios in lithography increase, hard masks require higher etch selectivity.

Current methods of forming carbon hard masks use plasma enhanced chemical vapor deposition (PECVD) processes and result in hardmasks with poor deposition uniformity and low etch selectivity. Accordingly, there is a need in the art for methods of forming carbon hard masks to improve deposition uniformity and etch selectivity.

SUMMARY

Embodiments of the present disclosure generally relate to a method for forming a nitrogen-doped carbon hardmask. In one embodiment, the method includes flowing an argon containing gas into a process chamber, flowing a nitrogen containing gas into the process chamber, igniting a plasma in the process chamber, flowing a precursor gas into the process chamber after igniting the plasma, performing a deposition process at a temperature of about 560 degrees C. to about 700 degrees C., and forming a nitrogen doped carbon hardmask.

In another embodiment, the method includes flowing an argon containing gas into a process chamber, flowing a nitrogen containing gas into the process chamber, applying a radio frequency power to the argon containing gas and the nitrogen containing gas to ignite a plasma, flowing a precursor gas into the process chamber after igniting the plasma, performing a deposition process at a temperature of about 560 degrees C. to about 700 degrees C., and forming a nitrogen doped carbon hardmask.

In another embodiment, the method includes flowing an argon containing gas into a process chamber, flowing a nitrogen containing gas into the process chamber, a nitrogen containing gas to argon containing gas ratio being about 1:3 to about 1:10, applying a radio frequency power to the argon containing gas and the nitrogen containing gas to ignite a plasma, flowing an organic precursor gas into the process chamber after igniting the plasma, performing a deposition process at a temperature of about 560 degrees C. to about 700 degrees C., and forming a nitrogen doped carbon hardmask on a substrate within the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
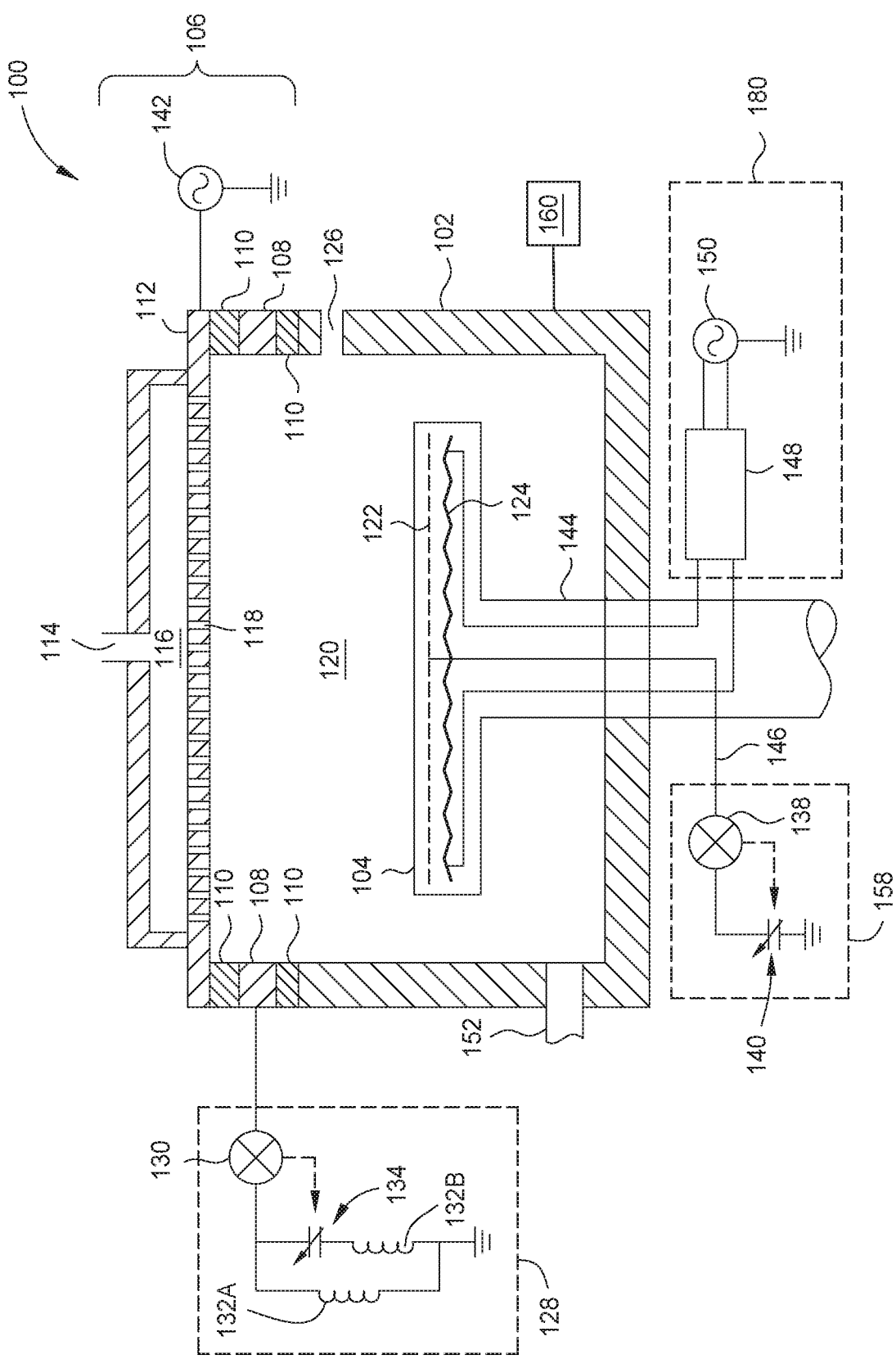
FIG. 1 is a schematic cross sectional view of a process chamber equipped to perform plasma enhanced chemical vapor deposition (PECVD) processes.

FIG. 1 is a schematic cross sectional view of a process chamber 100 equipped to perform plasma enhanced chemical vapor deposition (PECVD) processes. The processing chamber 100 features a chamber body 102, a substrate support 104 disposed inside the chamber body 102, and a lid assembly 106 coupled to the chamber body 102 and enclosing the substrate support 104 in a processing volume 120. Substrates are provided to the processing volume 120 through an opening 126, which may be sealed for processing using a valve.

A first electrode 108 is disposed adjacent to the chamber body 102 and separates the chamber body 102 from other components of the lid assembly 106. The first electrode 108 may be part of the lid assembly 106, or may be a separate side wall electrode. The first electrode 108 may be an annular, or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode. The first electrode 108 may also be a plate electrode, for example a secondary gas distributor.

An isolator 110, which is a dielectric material such as a ceramic or metal oxide, for example aluminum oxide and/or aluminum nitride, contacts the first electrode 108 and separates the first electrode 108 electrically and thermally from a gas distributor 112 and from the chamber body 102. The gas distributor 112 features openings 118 for admitting process gas into the processing volume 120. The gas distributor 112 is coupled to a source of electric power 142, such as an RF generator. DC power, pulsed DC power, and pulsed RF power may also be used.

The gas distributor 112 may be a conductive gas distributor or a non-conductive gas distributor. The gas distributor 112 may also be made of conductive and non-conductive components. For example, a body of the gas distributor 112 may be conductive while a face plate of the gas distributor 112 is non-conductive. In a plasma processing chamber, the gas distributor 112 may be powered, as shown in FIG. 1, or the gas distributor 112 may be coupled to ground.

The electrode 108 is coupled to a tuning circuit 128 that controls a ground pathway of the processing chamber 100. The tuning circuit 128 comprises an electronic sensor 130 and an electronic controller 134, which may be a variable capacitor. The tuning circuit 128 may be an LLC circuit comprising one or more inductors 332. The tuning circuit 128 may be any circuit that features a variable or controllable impedance under the plasma conditions present in the processing volume 120 during processing. In the embodiment of FIG. 1, which may be combined with other embodiments, the tuning circuit 128 features a first inductor 132A in series with the electronic controller 134 and a second inductor 132б in parallel with the electronic controller 134. The electronic sensor 130 may be a voltage or current sensor, and may be coupled to the electronic controller 134 to afford a degree of closed-loop control of plasma conditions inside the processing volume 120.

A second electrode 122 is coupled to or disposed in the substrate support 104. The second electrode 122 may be a plate, a perforated plate, a mesh, a wire screen, or any other distributed arrangement. The second electrode 122 may be a tuning electrode, and may be coupled to a second tuning circuit 136 by a conduit 146 disposed in a shaft 144 of the substrate support 104. The second tuning circuit 136 includes a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode and/or an electrostatic chucking electrode, is coupled to the substrate support 104. The third electrode is coupled to a second source of electric power 150 through a filter 148, which may be an impedance matching circuit 180. The second source of electric power 150 may be DC power, pulsed DC power, RF power, pulsed RF power, or a combination thereof.

The lid assembly 106 and substrate support 104 of FIG. 1 may be used with any processing chamber for plasma or thermal processing. One example of a plasma processing chamber with which the lid assembly 106 and substrate support 104 may be beneficially used is the PRODUCER® platform and chambers available from Applied Materials, Inc., located in Santa Clara, Calif. Chambers from other manufacturers may also be used with the components described above.

In operation, the processing chamber 100 affords real-time control of plasma conditions in the processing volume 120. A substrate is disposed on the substrate support 104, and process gases are flown through the lid assembly 106 according to any predetermined flow plan. For example, the process gases are flown through an inlet 114 into a plenum 116. The process gases then flow from the plenum to the processing volume through the openings 118. Gases exit the chamber 100 through an outlet 152. Electric power is coupled to the gas distributor 112 to establish a plasma in the processing volume 120. The substrate may be subjected to an electrical bias using the third electrode 124, if desired.

Upon energizing a plasma in the processing volume 120, a potential difference is established between the plasma and the first electrode 108. A potential difference is also established between the plasma and the second electrode 122. The electronic controllers 134 and 140 are then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers are both variable capacitors, the electronic sensors may adjust the variable capacitors to maximize deposition rate and minimize thickness non-uniformity independently.

A controller, such as the controller 160 is also part of the processing chamber 100. The controller 160 controls the processes and operations within the processing chamber 100. The controller 160 may also control the supply of power to any of the electrodes described herein, such as the first electrode 108, the second electrode 122, and the third electrode 124.

While Figure describes a process chamber 100 which can be used with aspects of the present disclosure, it is contemplated that other process chambers may also benefit from, or be used to perform, aspects described herein.

Figure 2A:
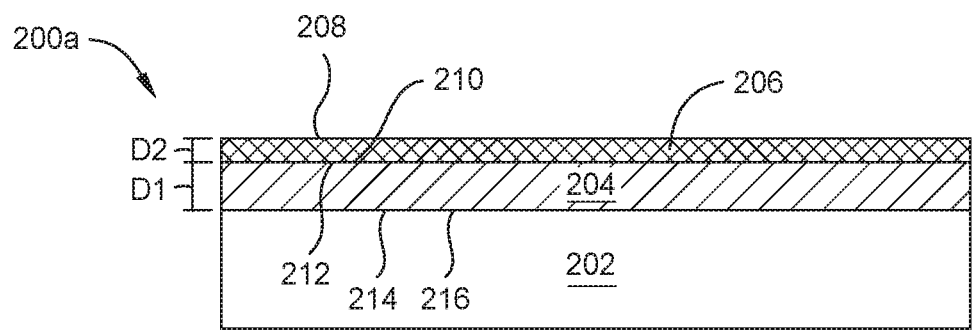
FIG. 2A-2C are cross sectional views of a device during different operations of processing.
Figure 2B:
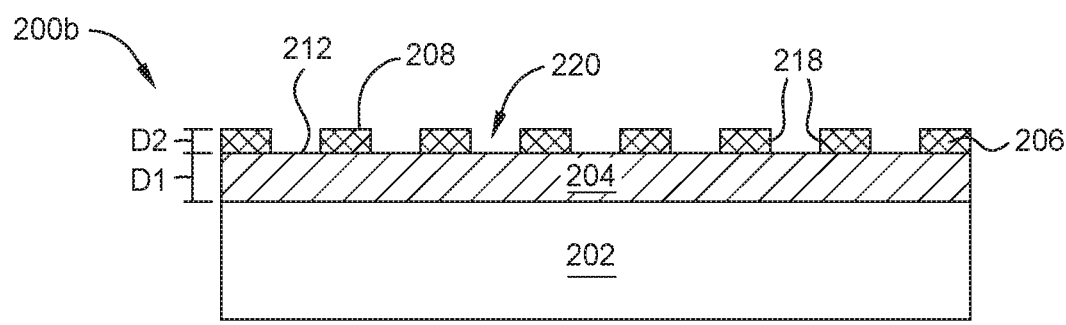
Figure 2C:
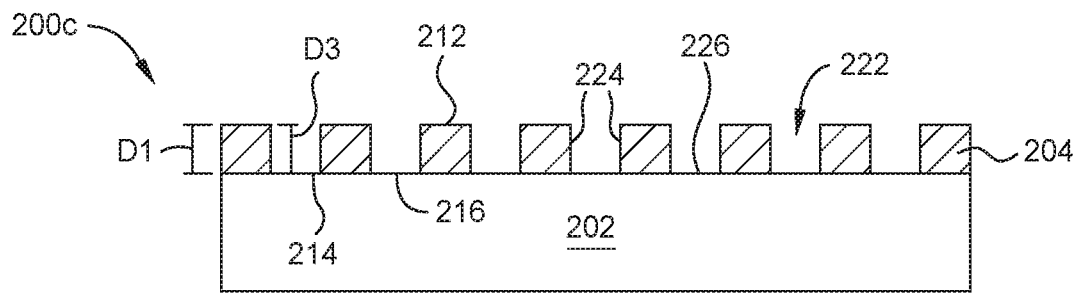

FIG. 2A-2C are a cross sectional views of a device 200a during different operations of processing. With reference to FIG. 2A, the device 200a includes a substrate 202, a hardmask layer 204, and a photoresist layer 206. The photoresist layer 206 is disposed on top of the hardmask layer 204. The hardmask layer is disposed on top of the substrate 202.

The substrate 202 may be any suitable substrate. In one embodiment, the substrate 202 may be a silicon substrate, such as a silicon wafer. In another embodiment, the substrate 202 may be a doped-silicon substrate. Alternatively, the substrate 202 may be a combination of multiple semiconductor device layers. The substrate 202 is a continuous layer as shown, but other topographies, including device features formed in the substrate 202, are contemplated.

The hardmask layer 204 is a doped carbon hardmask film. The doped carbon hardmask film may be a nitrogen-doped carbon hardmask film. The hardmask layer 204 may be deposited on the substrate 202 by a PECVD process. The hardmask layer 204 in the device 200a is a continuous layer. The hardmask layer 204 is formed over the entirety of the substrate 202. The thickness of the photoresist layer 204 is a first thickness D1. The first thickness D1 of the hardmask layer 204 is about 1 um to about 5 um, such as about 1.5 um to about 4 um, such as about 1.7 um to about 3.5 um. In some embodiments, the thickness of the hardmask layer 204 is greater than 1.5 um, such as greater than 1.7 um.

In the device 200a, the photoresist layer 206 has a top resist surface 208 and a bottom resist surface 210. The bottom resist surface 210 contacts the top mask surface 212. The top mask surface 212 is the top surface of the hardmask layer 204. The bottom surface of the hardmask layer 204 is the bottom mask surface 214. The bottom mask surface 214 is in contact with the top substrate surface 216. The top substrate surface 216 is the top surface of the substrate 202.

The photoresist layer 206 is any suitable photoresist material and may have been deposited on the substrate by any suitable deposition process. The photoresist layer 206 may be a negative or a positive photoresist. In one example, the photoresist is a diazonapthoquinone-novalac resin. The photoresist layer 206 of the device 200a is a continuous layer of photoresist. The layer of photoresist layer 206 is planar and has a constant and predetermined thickness. The thickness of the photoresist layer 206 is a second thickness D2. The second thickness D2 of the photoresist layer 206 is about 0.5 urn to about 2.5 um, such as about 1 um to about 2 um. Other hardmask layers (not shown) may also be disposed beneath the photoresist layer 206 to transfer the pattern onto the doped carbon hardmask. The thickness of the other hardmask layers (not shown) may be about 0.5 um to about 1.5 um, such as about 1 um.

FIG. 2B is a cross sectional side view of a device 200b at a second point in time. The device 200b is similar to the device 200a described in FIG. 2A. In the device 200b, the photoresist layer 206 is exposed to a photon source, and then openings 220 are subsequently etched through the photoresist layer 206.

The openings 220 include sidewalls 218. The sidewalls 218 are vertical sidewalls, but may alternatively be formed at an angle. The openings 220 in the photoresist layer 206 extend vertically through the photoresist layer 206. The openings 220 extend through the bottom resist surface 210, such that the openings 220 expose portions of the top mask surface 212. In this embodiment, the openings 220 extend through the entire second thickness D2 of the photoresist layer 206.

The openings 220 are formed by an exposure process and then baked and/or developed. The patterned photoresist layer may be patterned by any suitable method, such as exposure to an etchant. The patterned photoresist layer patterns the hardmask layer 204. Etch processes are utilized in which the etch selectivity of the hardmask layer 204 is relatively high. High etch selectivity increases pattern fidelity and line-width control.

FIG. 2C is a cross sectional side view of a device 200 at a third point in time. The device 200c is similar to the devices 200a and 200b described in FIGS. 2A-2B. In the device 200c, a selective etch of the hardmask layer 204 has occurred and the photoresist layer 206 is removed. The hardmask openings 222 are formed in a predetermined pattern through the hardmask layer 204.

The hardmask openings 222 have sidewalls 224 and a bottom surface 226 within each of the hardmask openings 222. The sidewalls 224 are vertical walls that extend into the hardmask layer 204. The bottom surface 226 of the hardmask openings 222 is the bottom resist surface 214, such that the depth D3 of the openings 222 is equal to the first thickness D1 of the photoresist layer 204. The hardmask openings 222 have a depth D3 that is equal to the first thickness D1 of the hardmask layer 204. When the depth D3 of the hardmask openings 222 is equal to the first thickness D1 of the hardmask layer 204, the bottom surface 226 of the hardmask openings 222 is the top substrate surface 214.

Figure 3:
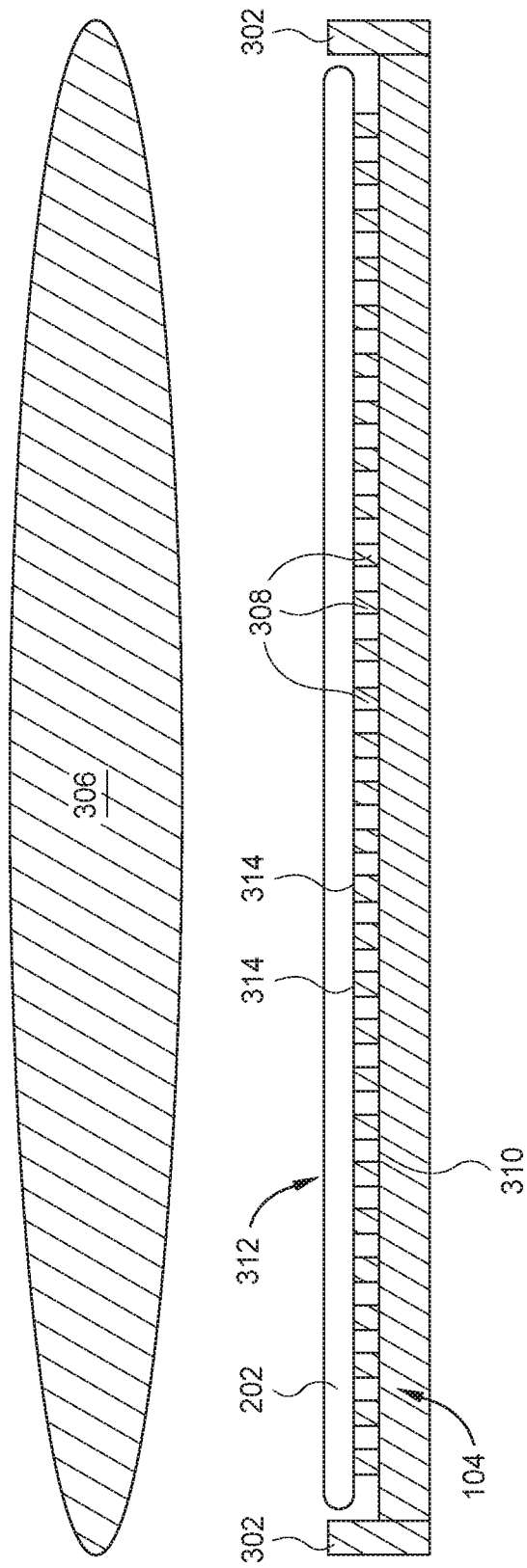
FIG. 3 is a cross sectional view of a substrate support, substrate, and plasma during PECVD processes.

FIG. 3 is a cross sectional side view of a substrate support 104 during PECVD processes. The substrate support 104 includes a support surface 310, a plurality of posts 308 disposed on top of the support surface 310, and an edge ring 302 surrounding the support surface 310. The edge ring 302 and the support surface 310 form a pocket 312 in which a substrate 202 is disposed. The substrate 202 is disposed on top of the plurality of posts 308 within the pocket 312. The upper surface 314 of the posts 308 defines the substrate 202 receiving surface.

Upper surfaces of the plurality of posts 308 are substantially coplanar. The plurality of posts 308 may be any suitable shape, such as rectangular posts, circular posts, oval posts, hexagonal posts, or other shapes. The posts 308 are designed to reduce backside damages to the substrate 202 and reduce temperature variations throughout the substrate 202. The edge ring 302 extends above the upper surface 324 of the posts 308 and surrounds the support surface 310. When a substrate 202 is placed on the plurality of posts 308, the edge ring 302 extends around the outer circumference of the substrate 202. In embodiments in which the substrate 202 is non-circular, the edge ring 302 extends around an outer perimeter of the substrate 202.

A plasma 306 is formed above the substrate 202. The plasma 306 is formed from a combination of process gasses, such as nitrogen-containing gases, argon, and hydrocarbon precursors. The gasses used to form the plasma 306 enter the chamber through the inlet 114 and the openings 118 within the gas distributor 112 (shown in FIG. 1). The plasma 306 is formed and controlled by supplying power to a combination of the first electrode 108, the second electrode 122, and/or the third electrode 124. The plasma may be used to deposit a carbon hardmask, such as a nitrogen-doped carbon hardmask.

Figure 4:
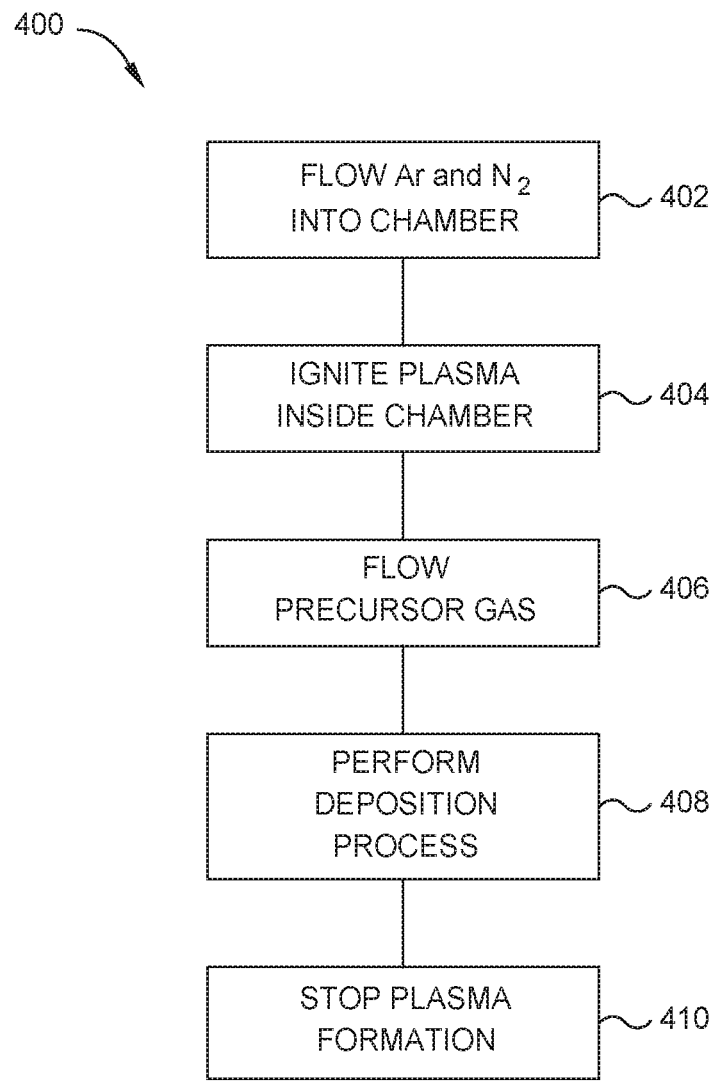
FIG. 4 is a method of depositing a nitrogen-doped carbon hardmask.

FIG. 4 is a method 400 of depositing a nitrogen-doped carbon hardmask. The nitrogen-doped hardmask is formed using a nitrogen containing gas, an argon gas, and a hydrocarbon precursor gas.

The method 400 is carried out at a temperature of about 560 degrees Celsius (C) to about 700 degrees C. In some embodiments, the method 400 may be carried out at a temperature of about 600 degrees C. to about 650 degrees C., such as about 620 degrees C. to about 640 degrees C., such as about 630 degrees C. The method 400 is carried out at a pressure of about 6 Torr to about 12 Torr. In some embodiments, the method 400 is conducted at a pressure of about 8 Torr to about 10 Torr, such as 8 Torr to about 9 Torr or 9 Torr to about 10 Torr.

The method 400 includes a first operation 402 of flowing an argon containing gas and a nitrogen containing gas into the process chamber. The process chamber may be the processing chamber 100 of FIG. 1. The argon containing gas is elemental argon (Ar). The nitrogen containing gas may be diatomic nitrogen ($N_2$), nitrogen dioxide ($NO_2$), ammonia ($NH_3$), or other suitable nitrogen containing gas.

The argon containing gas is flown into the process chamber at a flow rate of about 2000 sccm to about 4000 sccm. In some embodiments, which may be combined with other embodiments, the flow rate of the argon containing gas is about 2100 sccm to about 2750 sccm. In some embodiments, which may be combined with other embodiments, the flow rate of the argon containing gas is about 2100 sccm to about 2200 sccm. In other embodiments, which may be combined with yet other embodiments, the flow rate of the argon containing gas is about 3000 to about 4000 sccm, such as about 3250 sccm to about 3750 sccm, such as about 3400 sccm to about 3650 sccm, such as about 2500 sccm to about 3550 sccm.

The nitrogen containing gas is flown into the process chamber at a flow rate of about 250 sccm to about 1000 sccm. In some embodiments, which may be combined with other embodiments, the flow rate of the nitrogen containing gas is about 350 to about 900 sccm. In some embodiments, which may be combined with other embodiments, the flow rate of the nitrogen containing gas is about 350 sccm to about 600 sccm, such as about 400 sccm to about 550 sccm, such as about 450 sccm to about 550 sccm. In other embodiments, which may be combined with yet other embodiments, the flow rate of the nitrogen containing gas is about 500 sccm to about 1100 sccm, such as about 550 sccm to about 1000 sccm, such as about 650 sccm to about 950 sccm, such as about 700 sccm to about 900 sccm.

In some embodiments, which may be combined with other embodiments, the flow of the argon containing gas and the nitrogen containing gas can flow at different rates throughout the method 400. In other embodiments, the flow rate of the argon containing gas and the nitrogen containing gas is constant throughout the method 400.

The nitrogen containing gas flow rate to argon containing gas flow rate ratio is about 1:3 to about 1:10. In some embodiments, which may be combined with other embodiments, the nitrogen containing gas flow rate to argon containing gas flow rate ratio is about 1:3 to about 1:6, such as about 1:3 to about 1:5, such as about 1:3.5 to about 1:5, such as about 1:4 to about 1:5.

In some embodiments, which may be combined with other embodiments, the argon containing gas and the nitrogen containing gas may begin being flown into the process chamber separately, such that either the argon containing gas or the nitrogen containing gas is introduced alone first. In some embodiments, which may be combined with other embodiments, the argon containing gas is flown into the process chamber first, before the nitrogen containing gas is introduced into the chamber. In other embodiments, which may be combined with other embodiments, the nitrogen containing gas is flown into the process chamber first, before the argon containing gas is introduced into the chamber. In some embodiments, which may be combined with other embodiments, both the argon containing gas and the nitrogen containing gas are flown into the process chamber simultaneously.

After the first operation 402, a second operation 404 is performed and a plasma is ignited within the process chamber. The plasma is ignited from the nitrogen and argon containing gases introduced to the process chamber in the first operation 402.

Igniting the plasma within the process chamber during the second operation 404 includes applying an RF power of about 2000 Watts to about 5500 Watts, such as about 2000 Watts to about 5000 Watts, such as about 2000 Watts to about 4000 Watts. In some embodiments, which may be combined with other embodiments, an RF power of about 2000 Watts to about 2250 Watts is applied to ignite the plasma within the process chamber. In other embodiments, which may be combined with other embodiments, an RF power of about 3000 Watts to about 5500 Watts, such as about 3250 Watts to about 5000 Watts, such as about 3250 Watts to about 4500 Watts, such as about 3400 Watts to about 4000 Watts is applied to ignite the plasma within the process chamber.

The RF power is applied to the gas distributor 112 (shown in FIG. 1) by the source of electric power 142 and ignites the plasma between the gas distributor and the substrate support 104 by applying the RF power to the argon containing gas and the nitrogen containing gas. The electrode 108 and the second electrode 122 may be utilized separately to control the plasma shape and flow within the processing volume 120.

The RF power is maintained after the initial ignition of the plasma and during subsequent operations, such as the third and fourth operations 406, 408 of the method 400 described herein.

A third operation 406 of the method 400 is performed subsequent to the second operation 402 and the igniting the plasma. At the third operation 406, a precursor gas is flown into the process chamber. The precursor gas is a hydrocarbon or organic compound gas suitable for the deposition of a carbon hardmask. For example, the precursor gas includes any one of acetylene ($C_2H_2$), methane ($CH_4$), ethane ($C_2H_6$), propane ($C_3H_8$), propene ($C_3H_6$), cyclopropane ($C_3H_6$), butane ($C_4H_{10}$), pentane ($C_5H_{12}$), hexane ($C_6H_{14}$), heptane ($C_7H_{16}$), octane ($C_8H_{18}$), nonane ($C_9H_{20}$), decane ($C_{10}H_{22}$), undecane ($C_{11}H_{24}$), dodecane ($C_{12}H_{26}$), etc. Other organic compounds may also be utilized.

The flow rate of the precursor gas is about 300 sccm to about 900 sccm, such as about 350 sccm to about 800 sccm, such as about 350 sccm to about 750 sccm. In some embodiments, the flow rate of the precursor gas may be about 300 to about 500 sccm, such as about 350 sccm to about 450 sccm. In other embodiments, the flow rate of the precursor gas may be about 500 sccm to about 900 sccm, such as about 550 sccm to about 800 sccm, such as about 600 sccm to about 750 sccm, such as about 650 sccm to about 700 sccm.

The ratio of the flow rate of the precursor gas to the flow rate of the combined argon containing and nitrogen containing gases may be about 1:15 to about 1:3, such as about 1:10 to about 1:5, such as about 1:9 to about 1:6, such as about 1:8 to about 1:6, such as about 1:7 to about 1:6. The introduction of the precursor gas enables the deposition of the carbon hardmask as the precursor gas ionizes as a result of the plasma formed in operation 404. If a greater ratio of precursor gas to argon containing and nitrogen containing gases is used, the composition of the hardmask changes such that the ratio of nitrogen to carbon within the hardmask decreases. If a smaller ratio of precursor gas to argon containing and nitrogen containing gases is used, the composition of the hardmask changes such that the ratio of nitrogen to carbon within the hardmask increases.

After the introduction of the precursor gas into the process chamber, a fourth operation 408 of performing a deposition process is performed. During the performing the deposition process, a nitrogen-doped hardmask is deposited onto the substrate, such as the substrate 202 of FIGS. 2 and 3. The nitrogen-doped hardmask may be the hardmask layer 206 of FIGS. 2A-2C. The deposition rate during the fourth operation 408 may be about 2500 Angstroms/minute to about 8000 Angstroms/minute, such as about 3000 Angstroms/minute to about 7500 Angstroms/minute, such as about 3000 Angstroms/minute to about 5000 Angstroms/minute, such as about 3200 Angstroms/minute to about 3500 Angstroms/minute. In some embodiments, the deposition rate of the nitrogen-doped hardmask may be about 3500 Angstroms/minute to about 6000 Angstroms/minute, such as about 3750 Angstroms/minute to about 5000 Angstroms/minute. The deposition rate is influenced by the applied RF power for the formation of the plasma in operation 404. As the applied RF power increases, the deposition rate increases.

The nitrogen-doped hardmask may be deposited until the hardmask reaches a predetermined thickness, such as a thickness of about 0.5 um to about 6 um, such as about 1 um to about 5 um, such as about 1.5 um to about 4 um, such as about 1.7 um to about 3.5 um. In some embodiments, the thickness of the nitrogen-doped hardmask may be about 5 um or greater. The bow of the nitrogen-doped carbon hardmask may be about 30 um to about 40 um, such as about 32 um to about 38 um, such as about 33 um to about 37 um. The internal stress within the nitrogen-doped carbon hardmask may be about 30 MPa to about 37 MPa, such as about 32 MPa to about 36 MPa, such as about 32.5 MPa to about 35 MPa. The nitrogen composition within the nitrogen-doped hardmask is less than about 16% of the atomic concentration of the nitrogen-doped hardmask, such as less than about 15%, or less than about 10% of the atomic concentration of the nitrogen-doped hardmask. In some embodiments, the atomic percent of nitrogen within the nitrogen-doped hardmask is about 1% to about 16%, such as about 2% to about 16%, such as about 3% to about 16%, such as about 4% to about 16%, such as about 5% to about 16%, such as about 6% to about 16%, such as about 7% to about 16%, such as about 8% to about 16%, such as about 1% to about 15%, such as about 1% to about 10%, such as about 2% to about 10%, such as about 3% to about 10%, such as about 4% to about 10%, such as about 5% to about 10%. In some embodiments, the atomic percent of nitrogen within the nitrogen-doped hardmask is about 5% to about 9%, such as about 5% to about 8%. Increased RF power increased the incorporation of nitrogen within the nitrogen-doped carbon hardmask.

After the nitrogen-doped carbon hardmask has reached a desired thickness, the plasma formation is stopped in operation 410. The plasma formation may be stopped by ceasing the application of RF power to the gas distributor 112 and ceasing the flow of the precursor gas into the process chamber. After the plasma formation and flow of the precursor gas into the process chamber is ceased, the flow of the argon containing gas and the nitrogen containing gas may be ceased. The process chamber is then evacuated before the removal of the substrate from the process chamber through an opening, such as the opening 126 of the processing chamber 100 in FIG. 1.

It is noted that the gas flow rates provided herein are applicable to 300 mm round substrates, and that the gas flow rates may be scaled for substrates of other shapes and sizes.

Figure 5:
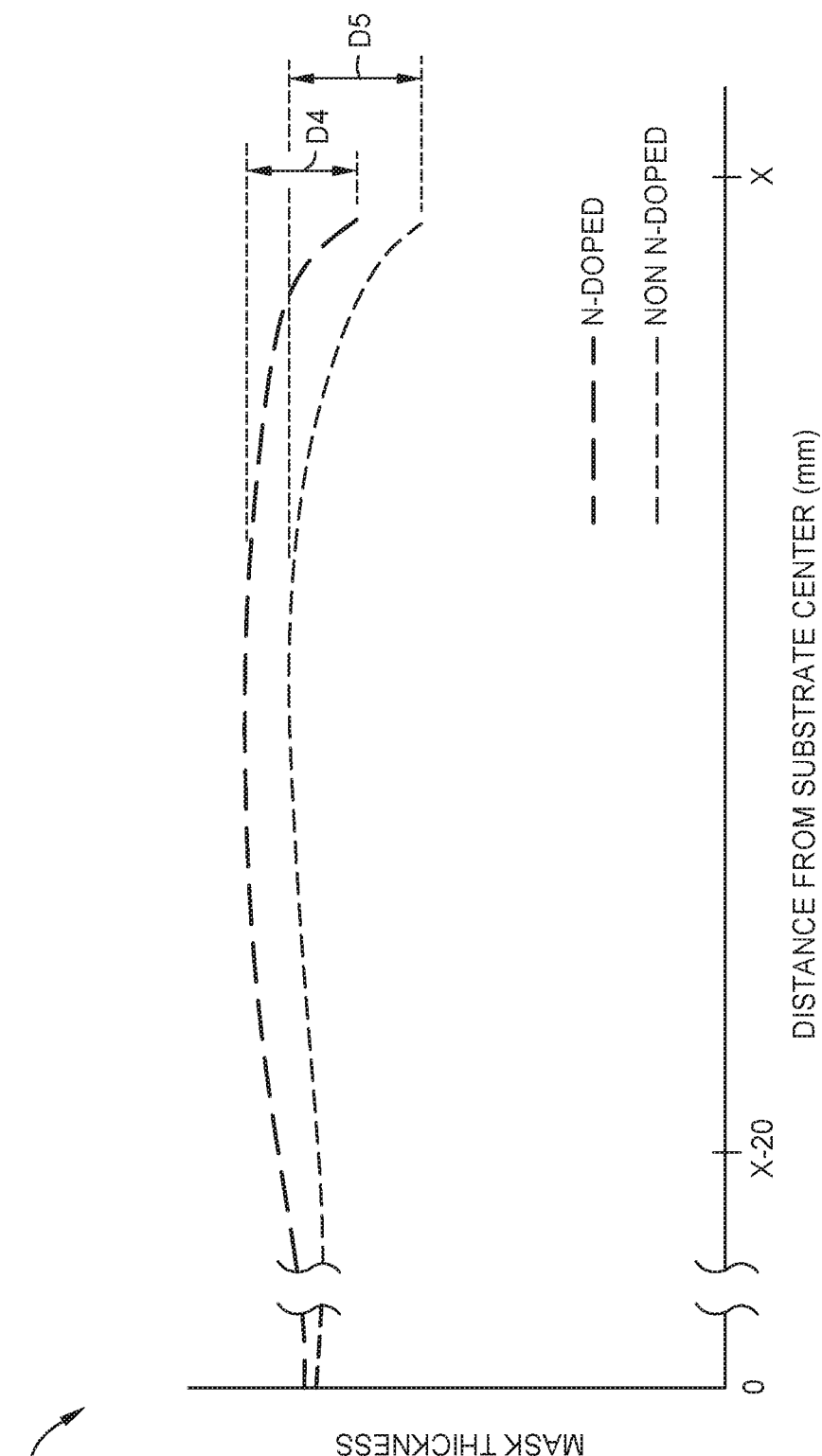
FIG. 5 is a graph illustrating mask thicknesses at an edge of the substrate.

FIG. 5 is a graph 500 illustrating mask thicknesses at an edge of the substrate for nitrogen-doped and undoped carbon hardmasks. The edge of the mask is defined as the outer 20 mm of the radius of the mask. The thickness of the mask is graphed with mask thickness as the y-axis and independent variable, while the distance from the substrate center in millimeters is the x-axis and dependent variable.

Mask thickness is graphed for two different compositions of a carbon hardmask. In one embodiment, the thickness profile of a nitrogen-doped carbon hardmask is graphed. The nitrogen-doped carbon hardmask is formed using the method 400 described herein. The nitrogen-doped carbon hardmask has an edge drop defined by D4 in FIG. 5. The nitrogen-doped carbon hardmask may have an edge drop D4 of about 55 nm to about 25 nm, such as about 51 nm to about 30 nm.

In another embodiment, the thickness profile of an undoped (e.g., a non nitrogen-doped) carbon hardmask is graphed. The non nitrogen-doped carbon hardmask is formed using a conventional hardmask formation processes. The non nitrogen-doped carbon hardmask has an edge drop defined by D5 in FIG. 5. The non nitrogen-doped carbon hardmask may have an edge drop D5 of about 65 nm to about 75 nm, such as about 67.5 nm to about 72.5 nm.

In embodiments in which the deposition rate of the carbon hardmasks described in the graph 5 are the same, the edge drop D4 of the nitrogen-doped carbon hardmask may be less than 50% of the edge drop D5 of the non nitrogen-doped carbon hardmask. By nitrogen-doping the carbon hardmask during the hardmask deposition, the edge drop is substantially reduced. Reduced edge drop results in more accurate patterning, enable smaller scale achievement of integrated circuits.

Figure 6:
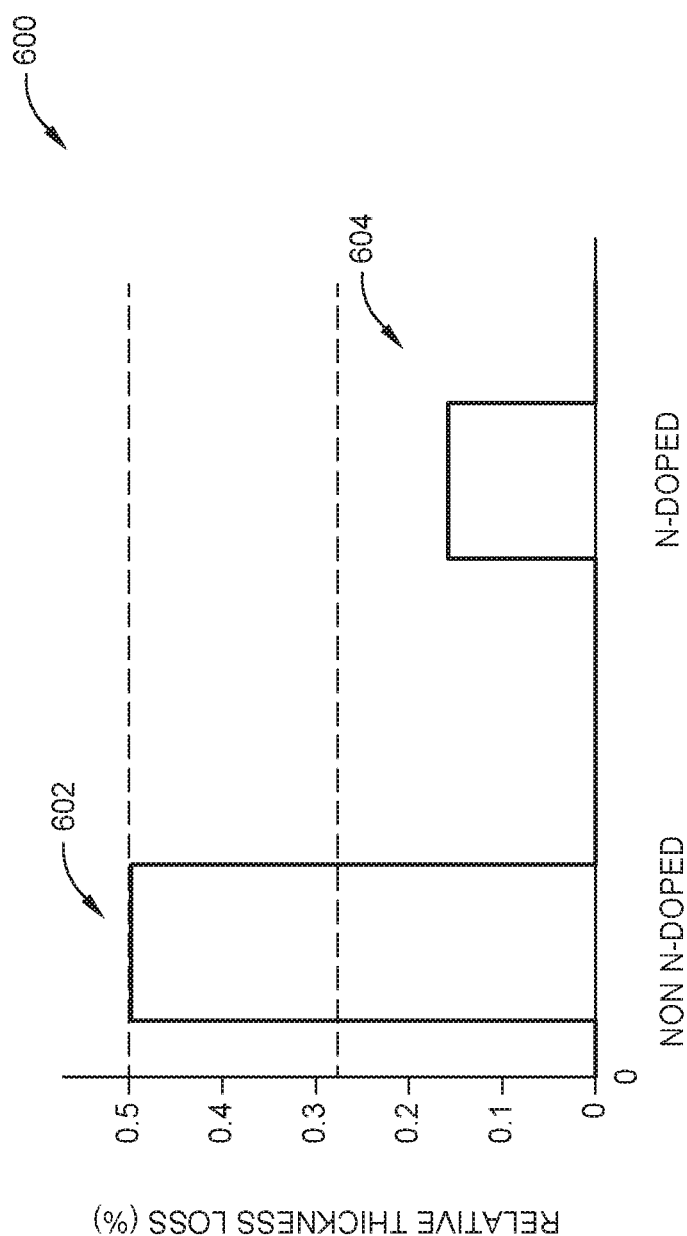
FIG. 6 is a chart illustrating film thickness differences after a first process and after a second process.

FIG. 6 is a chart 600 illustrating post location thickness loss for n-doped carbon hardmasks of the present disclosure as well as for conventional hardmasks. The chart 600 illustrates the average relative thickness loss at positions across the substrate where posts, such as the plurality posts 308 of FIG. 3, are contacting the underside of the substrate, such as the substrate 202 in FIG. 3, to facilitate support of the substrate 202. Thickness of the hardmask at parts of the substrate contacting the posts is lost due to thermal gradients within the substrate caused by thermal conduction from the posts. The thickness loss at portions of the hardmask above the posts results in a slight dimpling effect on the surface of the hardmask. It is generally beneficial to reduce the dimpling effect caused by the posts, resulting in a more planar hardmask and more uniform patterning. The more uniform patterning enables higher aspect ratios to be achieved.

Experimental results have shown non nitrogen-doped carbon hardmasks have a first average post location relative thickness loss 602, and nitrogen-doped carbon hardmasks have a second average post location relative thickness loss 604. The thickness losses in the chart 600 are the percent of thickness losses. As is shown in the graph 600, the percent thickness lost when utilizing the nitrogen-doped carbon hardmasks and the method 400 described herein is less than half of the percent thickness lost when utilizing conventional non nitrogen-doped carbon hardmasks and the related methods of hardmask formation. The reduction of the percent thickness lost is seen while utilizing method with similar deposition rates, such as the deposition rates described herein.

In some embodiments, which may be combined with other embodiments, the first average post location relative thickness loss is between about 0.45% to about 0.6%, such as about 0.5% to about 0.55%. In some embodiments, which may be combined with other embodiments, the second average post location relative thickness loss is between about 0.075% to about 0.25%, such as about 0.1% to about 0.2%, such as about 0.14%.

In some embodiments, which may be combined with other embodiments, the thickness profile uniformity of the hardmask layer is less than about 3%, such as between about 2.9% and about 2.4%, such as about 2.8% to about 2.5%. In some embodiments, the thickness profile uniformity of the nitrogen-doped carbon hardmask formed using methods described herein is about 2.7%. The thickness profile uniformity of the hardmask layer is calculated by subtracting the minimum profile thickness of the hardmask layer from the maximum profile thickness of the hardmask layer to provide a thickness range. The thickness range is then divided by two to create a half thickness range. The half thickness range is then divided by the average thickness across the hardmask layer and shown as a percentage. The hardmask layer thickness within 3.2 mm from the wafer edge is discounted while calculating the thickness profile uniformity. Previous methods for forming non nitrogen-doped carbon hardmasks produce thickness profile uniformities of greater than about 3%, such as greater than 3.35%.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
flowing an argon containing gas into a process chamber;
flowing a nitrogen containing gas into the process chamber, wherein a nitrogen containing gas to argon containing gas ratio is about 1:3 to about 1:10;
igniting a plasma in the process chamber;
flowing a precursor gas into the process chamber after igniting the plasma, wherein a ratio of a flow rate of the precursor gas to a flow rate of the combined argon containing and nitrogen containing gases is about 1:3 to about 1:15;
performing a deposition process at a temperature of about 560 degrees C. to about 700 degrees C.; and
forming a nitrogen doped carbon hardmask, wherein the nitrogen doped carbon hardmask has an atomic nitrogen composition of about 1% nitrogen to about 16% nitrogen and an edge drop of about 55 nm to about 25 nm, and wherein the nitrogen doped carbon hardmask has a relative thickness loss between about 0.075% and 0.25% and a bow of the nitrogen doped carbon hardmask is about 30 um to about 40 um.

2. The method of claim 1, wherein the argon containing gas is atomic argon.

3. The method of claim 1, wherein the nitrogen containing gas is diatomic nitrogen.

4. The method of claim 1, wherein the argon containing gas and the nitrogen containing gas are introduced simultaneously.

5. The method of claim 1, wherein the nitrogen containing gas has a flow rate of about 250 sccm to about 1000 sccm.

6. The method of claim 1, wherein the argon containing gas has a flow rate of about 2000 sccm to about 4000 sccm.

7. The method of claim 1, wherein a pressure during the flowing the argon containing gas and the flowing the nitrogen containing gas is about 6 Torr to about 12 Torr.

8. The method of claim 1, wherein the deposition process is performed at a temperature of about 600 degrees C. to about 650 degrees C.

9. The method of claim 8, wherein a radio frequency power applied during ignition of the plasma is about 3250 Watts to about 5000 Watts.

10. A method of processing a substrate comprising:
flowing an argon containing gas into a process chamber;
flowing a nitrogen containing gas into the process chamber, wherein a nitrogen containing gas to argon containing gas ratio is about 1:3 to about 1:10;
applying a radio frequency power to the argon containing gas and the nitrogen containing gas to ignite a plasma, wherein the radio frequency power is about 3250 Watts to about 5000 Watts;
flowing a precursor gas into the process chamber after igniting the plasma, a ratio of a flow rate of the precursor gas to a flow rate of the combined argon containing and nitrogen containing gases is about 1:3 to about 1:15;
performing a deposition process at a temperature of about 560 degrees C. to about 700 degrees C.; and
forming a nitrogen doped carbon hardmask, wherein the nitrogen doped carbon hardmask has a thickness of about 0.5 um to about 6 um, a thickness profile uniformity of less than about 3%, an atomic nitrogen composition of about 1% nitrogen to about 16% nitrogen, and a change in a thickness of the nitrogen doped carbon hardmask for an outer 20 mm of a radius of the nitrogen doped carbon hardmask is about 55 nm to about 25 nm.

11. The method of claim 10, wherein the precursor gas is a hydrocarbon.

12. The method of claim 11, wherein the precursor gas is any one of acetylene ($C_2H_2$), methane ($CH_4$), ethane ($C_2H_6$), propane ($C_3H_8$), propene ($C_3H_6$), cyclopropane ($C_3H_6$), butane ($C_4H_{10}$), pentane ($C_5H_{12}$), hexane ($C_6H_{14}$), heptane ($C_7H_{16}$), octane ($C_8H_{18}$), nonane ($C_9H_{20}$), decane ($C_{10}H_{22}$), undecane ($C_{11}H_{24}$), or dodecane ($C_{12}H_{26}$).

13. The method of claim 12, wherein the hydrocarbon is propene ($C_3H_6$).

14. The method of claim 13, wherein the precursor gas is introduced at a flow rate of about 300 sccm to about 900 sccm.

15. The method of claim 10, wherein the deposition process is performed as a deposition rate of about 2500 Angstroms/minute to about 8000 Angstroms/minute.

16. The method of claim 10, wherein the argon containing gas is atomic argon.

17. The method of claim 10, wherein the nitrogen containing gas is diatomic nitrogen.

18. The method of claim 1, wherein the nitrogen doped carbon hardmask has a thickness of about 0.5 um to about 6 um and a thickness profile uniformity of less than about 3%.

19. The method of claim 10, wherein the nitrogen doped carbon hardmask has a relative thickness loss between about 0.075% and 0.25% and a bow of the nitrogen doped carbon hardmask is about 30 um to about 40 um.

20. A method of processing a substrate, comprising:
flowing an elemental argon gas into a process chamber;
flowing a diatomic nitrogen gas into the process chamber, wherein a diatomic nitrogen gas to elemental argon gas ratio is about 1:3 to about 1:6;
applying a radio frequency power to the diatomic nitrogen gas and elemental argon gas mixture to ignite a plasma in the process chamber;
flowing a precursor gas into the process chamber after igniting the plasma, wherein a ratio of a flow rate of the precursor gas to a flow rate of the combined argon containing and nitrogen containing gases is about 1:6 to about 1:9;
performing a deposition process at a temperature of about 600 degrees C. to about 650 degrees C.; and
forming a nitrogen doped carbon hardmask, wherein the nitrogen doped carbon hardmask has an atomic nitrogen composition of about 3% nitrogen to about 10% nitrogen and a change in a thickness of the nitrogen doped carbon hardmask for an outer 20 mm of a radius of the nitrogen doped carbon hardmask is about 55 nm to about 25 nm.

21. The method of claim 20, wherein a pressure during the deposition process is about 8 Torr to about 10 Torr, an internal stress within the nitrogen-doped carbon hardmask is about 30 MPa to about 37 MPa, and an average post location relative thickness loss is about 0.075% to about 0.25%.

* * * * *